(12) United States Patent
Yokozuka et al.

(10) Patent No.: US 7,445,455 B2
(45) Date of Patent: Nov. 4, 2008

(54) ELECTRONIC DEVICE

(75) Inventors: Takehide Yokozuka, Yokohama (JP); Masahide Harada, Yokohama (JP); Shiro Yamashita, Fujisawa (JP); Isamu Yoshida, Fujisawa (JP); Masahiko Asano, Mito (JP); Koji Sato, Hitachinaka (JP); Shuji Eguchi, Kamagaya (JP); Kaoru Uchiyama, Hitachioomiya (JP)

(73) Assignee: Hitachi, Ltd., Tokyo (JP)

( * ) Notice: Subject to any disclaimer, the term of this patent is extended or adjusted under 35 U.S.C. 154(b) by 313 days.

(21) Appl. No.: 11/183,972

(22) Filed: Jul. 19, 2005

(65) Prior Publication Data

US 2006/0068609 A1 Mar. 30, 2006

(30) Foreign Application Priority Data

Sep. 29, 2004 (JP) ............................. 2004-283027

(51) Int. Cl.
*H01R 12/00* (2006.01)
(52) U.S. Cl. ............................. 439/55; 439/66; 439/91; 439/591; 439/22; 439/935; 439/75; 439/83; 361/760; 174/262
(58) Field of Classification Search .................. 439/55, 439/935, 75, 83; 361/760, 752
See application file for complete search history.

(56) References Cited

U.S. PATENT DOCUMENTS

| 6,054,171 | A | * | 4/2000 | Shoji ........................... 438/106 |
| 6,114,005 | A | * | 9/2000 | Nagai et al. ................... 428/114 |
| 6,187,615 | B1 | * | 2/2001 | Kim et al. ..................... 438/113 |
| 6,924,440 | B2 | * | 8/2005 | Matsuda ........................ 174/256 |
| 2003/0162434 | A1 | * | 8/2003 | Kamiya ........................ 439/381 |
| 2004/0266162 | A1 | * | 12/2004 | Feng ............................ 438/613 |
| 2005/0020051 | A1 | * | 1/2005 | Tsai ............................. 438/613 |

FOREIGN PATENT DOCUMENTS

| EP | 0727931 | 8/1996 |
| EP | 0834966 | 4/1998 |
| EP | 1033787 | 9/2000 |
| JP | 06-076887 | 3/1994 |
| JP | 09-180831 | 7/1997 |

* cited by examiner

*Primary Examiner*—Dean A. Reichard
*Assistant Examiner*—Hoa C Nguyen
(74) *Attorney, Agent, or Firm*—Mattingly, Stanger, Malur & Brundidge, PC

(57) ABSTRACT

An electronic device comprises a circuit board which has a through hole and uses a resin with a glass transition temperature exceeding 150° C. as a base member, a metal casing which has an opening, and a connector which is fitted to the opening of the metal casing in which a pin of the connector is inserted into the through hole, the pin and the through hole are connected with a conductive member, and a reinforcement member for securing the connector and the board is further provided on the conductive member, thereby improving the reliability of the electronic device.

2 Claims, 4 Drawing Sheets

ELECTRONIC DEVICE

BACKGROUND OF THE INVENTION

1. Field of the Invention

The present invention relates to an electronic device and, more in particular, it relates to an electronic device having a connector for electrical connection with outside typically represented by an engine control unit (also abbreviated as ECU, hereinafter).

2. Description of the Related Art

Usually, electronic devices are subjected to heat cycle test before shipping. In particular, since the temperature in the vehicle changes greatly depending on on-off of an engine or change of circumstantial temperature, an electronic control device mounted on an automobile such as ECU is required to have a specification capable of withstanding to temperature cycles for a wide temperature region (usually, from −40 to 120° C.: based on the General Rules of Environmental Testing Methods for Automotive Electronic Equipment; JASO D001-94, established by Society of Automotive Engineers of Japan, Inc).

For such a temperature range, printed circuit boards having glass epoxy base member (described simply as FR4-type board, hereinafter) have been used generally for electronic circuits board since they are inexpensive.

An epoxy resin as a base member (a material utilized for the base member) of the FR4-type board has a glass transition temperature (also abbreviated as Tg, hereinafter) of about 125° C. which is soft and flexible particularly at high temperature. In ECU using such FR4-type board, the ECU is electrically connected with an external circuit as follows. At first, an opening is formed to an aluminum diecast for securing an electronic circuit board mounted with ECU. The electronic circuit board and the aluminum diecast are secured by fitting a connector main body having pin (for example, plural pins) into the opening of the aluminum die cast (base member formed with the pin). Then, pins for the connector (also referred as connector pins, hereinafter) are inserted into through holes extending through the electronic circuit board (FR4-type board). Then, the through holes and the pin are connected by soldering (such connection form is also referred as through hole connection, hereinafter).

FIG. 9 shows the cross sectional structural view of an existent (conventional) printed circuit board ECU.

A "continuous through hole" described in this specification is characterized, for example, by having an opening formed by being extended between main surfaces on both sides of the electronic circuit board, into which a member being inserted into or penetrating the electronic substrate is fitted. In other words, the continuous through hole, in view of essential feature that it is formed as an opening passing through the electronic board in the direction of the thickness, is distinguished from a so-called "usual through hole" with a main purpose of electrical connection between a plurality of conductive layers formed in the electronic board (isolated from each other in the direction of the thickness of the electronic board) in this specification.

The prior art concerning the connector (connector device) described above includes JP-A No. 6-76887 that discloses a reinforced structure for a pin portion by resin filling in a connector device.

SUMMARY OF THE INVENTION

Since ECU has recently tended to be located nearer to an engine, the specification for the upper limit of the temperature range has tended to be higher in the temperature cycle test for a wider temperature range (for example, −55 to 150° C.). For use in such temperature range, not a usual FR4-type board, but a board made of ceramics such as alumina is used. Since the ceramic substrate cannot be formed with continuous through hole, through hole connection with the external circuit described above is impossible and the connector terminal and the pad on the board are practically connected to by the wire-bonding method.

However, the wire bonding connection involves a problem of taking much manufacturing time along with increase of the number of terminals. Further, a need for ECU made of a printed circuit board is greater than the ceramic board for reduction in the cost of the ECU module.

In a case where the FR4-type board should be used or tested in a temperature circumstance as severe as −55 to 150° C., cracking destruction toward the inside of the board is caused at the end of the solder resist or at the end of the wirings on the surface of the board after several hundreds cycles. Since the insulation property of the board is deteriorated when such cracking destruction is caused, it cannot be said that sufficient reliability is provided.

High heat resistant board (also abbreviated as FR4.5-type board, hereinafter) of high Tg have been recently developed by board manufacturers. Those having Tg of about 150° C. to 180° C. have been developed generally although not yet popularized so much. In the use of FR4.5-type board, the board itself is not destroyed even when used for test in a severe temperature circumstance of −55 to 150° C.

Then, the present inventors have trially manufactured ECU as an automobile electronic device using an FR4.5-type board constituted with a base member having Tg in excess of 150° C.

As a result of actually manufacturing the ECU with the FR4.5-type board, it has been found that solder crackings are often caused in the solder connection portion at a relatively high probability. In particular, it has been found that large crackings are formed in the through hole connection portion described above (a portion in which a pin is inserted to the through hole), resulting in the deterioration of the connection reliability.

This is considered to be attributable to the followings:

A. A resin of high glass transition temperature Tg is rigid in view of the characteristics of a base member formed therewith.

B. Since the linear expansion coefficient of the connector resin is larger than that of an aluminum casing to which the connector main body is fitted, large warping deformation is developed to the casing during the temperature cycle test.

C. Stresses and/or strains are concentrated between the pin and the through hole of the board due to the difference of the linear expansion coefficient between the board and the connector resin.

The present invention intends to provide an automobile electronic device such as ECU using a circuit board constituted with a base member (a material used for that) having Tg exceeding 150° C.

For avoiding solder crackings, the present inventors have devised the following means.

At first, since the trigger of crackings in the through hole connection portion occurs at the surface of the solder connection portion, the portion is covered with other reinforcement member (e.g. a reinforcement material) for moderating stress concentration to the surface.

It is necessary that the cover member be an insulating member so as to keep insulation between adjacent pins.

Further, in view of the moldability, it is desirable that the member used for the cover member has a viscosity during coating and has a hardness comparable with or higher than that of the solder after setting. Accordingly, an epoxy series resin is effective to be used for the cover member for instance.

Coating of the member to the through hole solder connection portion on both surfaces of the circuit board is most effective but coating only for the single side is also effective.

Further, since requirement is not severe uniformly for the solder connection portion of all pins but the extent of stress concentration may sometimes differ locally such as on the outer side (or inside depending on the situation) of the connector, coating may be applied selectively in such a case.

Coating the rear side of the board (that is, the side thereof opposing to the aluminum casing to which the connector is fitted) with the resin may be performed by using a syringe having a long top end, or by injecting the resin into a through hole formed at the circuit board for resin injection using a syringe having a fine top end.

In JP-A No. 6-76887, a pin portion is reinforced by filling a resin in a connector device. However, the structure has a feature of providing a disk-shaped capacitor and a shield plate to the connector pin, with an aim of reinforcing connection therewith, and it does not describe in view of the reinforcement of the solder connection portion with the board.

It is also effective to decrease the rigidity of the connector pin.

While the pin diameter at the outside of the connector can not be changed optionally due to the restriction of the connection connector from the outside, the diameter for a portion in through hole connection with the board may be decreased.

When the diameter of the pin is changed inside the connector resin, the pin withdrawing strength can be improved.

In the same manner, to reduce the rigidity of the pin, it is also effective to bend the pin between the board through hole connection portion and the connector resin. It is more effective to bend the pin in the direction relatively away from the center of the circuit board.

It is also effective to enlarge a distance (space) between the board through hole connection portion and the connector resin.

In general, most of electronic parts are mounted on the surface of the board (the board surface) not facing the aluminum casing to which the connector is fitted (also referred as board surface A, hereinafter). In particular, a tall part, for example, an electrolytic capacitor is mounted on the board surface A in order to make the structure and the manufacture of the casing more simply. In a case where the distance (space) between the board through hole connection portion and the connector resin is enlarged while mounting such a part on the board surface A as it is, a larger inner volume is necessary for ECU.

However, since the external size of ECU is often designated by car manufacturers, it can not simply increase the inner volume of ECU.

Then, a tall part such as an electrolytic capacitor is mounted on the board surface opposing to the aluminum casing to which the connector is fitted (also referred as board surface B, hereinafter).

With such a structure, the distance between the board through hole connection portion and the connector resin can be enlarged without increasing the inner volume of ECU, and crackings in the solder through connection portion can be avoided.

According to the invention, electric connection reliability of an electronic device using a board having a through hole in which a resin having a glass transition temperature in excess of 150° C. is used as a base member can be improved.

DETAILED DESCRIPTION

Figure 2:
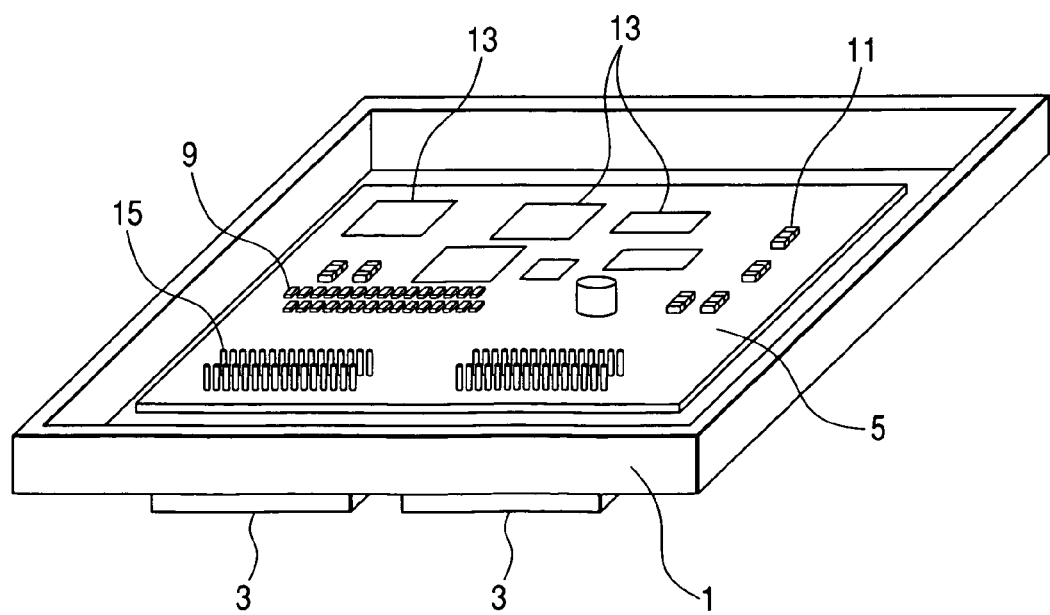
FIG. 2 is a perspective view of an ECU module.

FIG. 2 shows a perspective view of an engine control unit (ECU) module with a lid being detached as an example of an electronic device according to the present invention.

The ECU module includes an aluminum casing 1 (lid is not illustrated) formed with a connector 3 for input/output of signals relative to the external side, a circuit board 5 mounted on the aluminum casing 1, a semiconductor package 9 mounted on the circuit board 5, and silicone gel filling the inside of the casing 1.

In this embodiment, connector pins 15 are inserted into continuous through holes in the circuit board 5 and applied with solder connection, to thereby provide connection between the board and a connector.

While the silicone gel needs not always be used, it is filled with a view point of improving the reliability in this embodiment.

Figure 1:
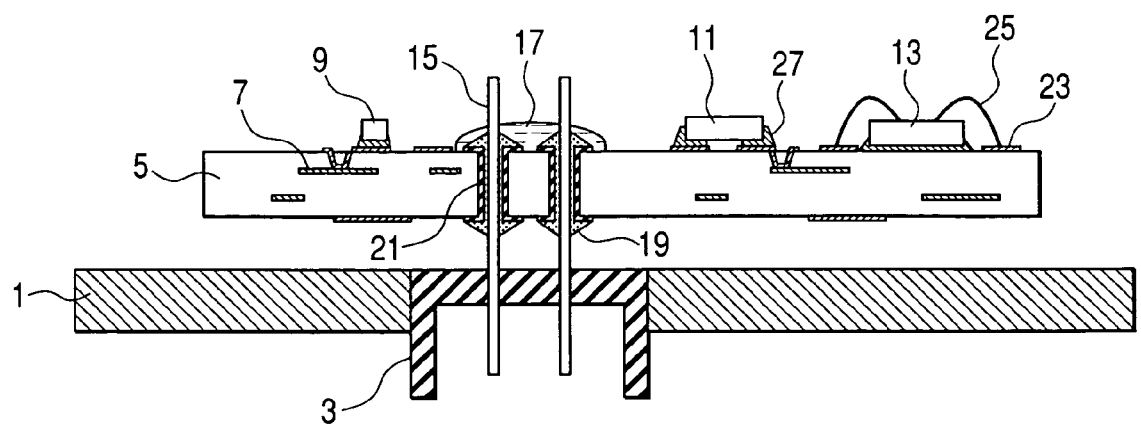
FIG. 1 is a cross sectional view of an electronic device.

FIG. 1 is a cross sectional view for FIG. 2. In FIG. 1, wall members (side walls) surrounding the circuit board 5 of the aluminum casing (metal casing) 1 shown in FIG. 2 and a lid covering the portion above the side wall members of the metal casing 1 which is not illustrated in FIG. 2 are not shown and they are not illustrated also in cross sectional views referred to hereinafter.

The semiconductor package 13 is connected to the circuit board 5 with solder by the die-bonding method and electrically connected by way of bonding wires 25 to a circuit layer (pad) 23.

The circuit board 5 is a circuit board having a resin (insulating) layer and a circuit layer 7. On the circuit board 5, electronic parts 9 and 11 in addition to the semiconductor package 13 are mounted by soldering and the semiconductor package is mounted by BGA (Ball Grid Array).

The connector includes a resin main body 3 and pins 15 in which 60 pins each having a diameter of about 0.6 mm are planted. Such two connectors are fitted into the openings of the aluminum casing. The circuit board 5 is formed with continuous through holes 21 larger than the pin size (about 1.3 mm diameter) in conformity with the number of pins and the pattern for the pin pitch, etc. of the connector pins 15. The continuous through hole is applied with electroless Cu plating, Ni plating, and gold plating successively. The pins 15 are inserted into the continuous through holes 21 to establish electrical connection with the solder 19. A reinforcement resin film of epoxy series 17 is formed so as to cover the solder 19.

While the reinforcement member 17 is made of an epoxy series resin in this embodiment, it may be an inorganic series adhesive. Non-conductive member is easy to handle with since it does not cause short-circuit even when coated so as to cover the adjacent pins entirely.

Figure 3:
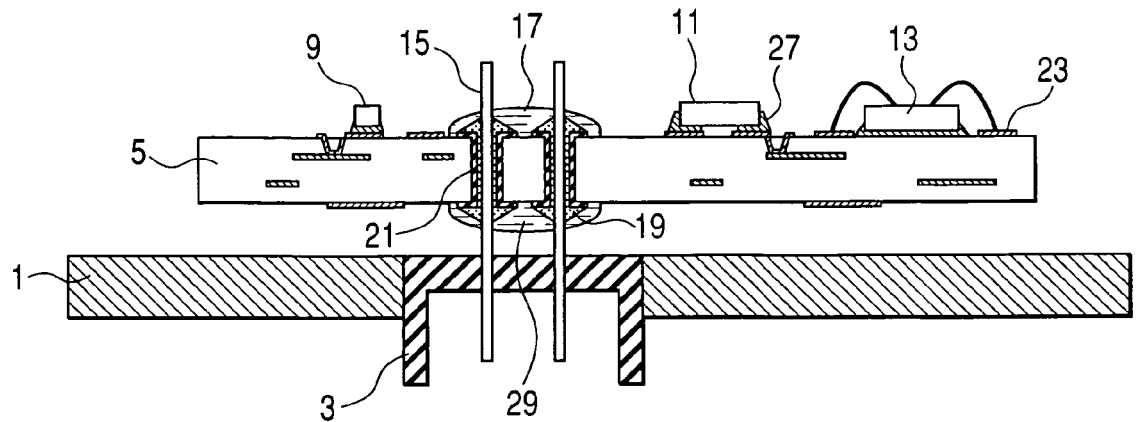
FIG. 3 is a cross sectional view of an electronic device.
Figure 4:
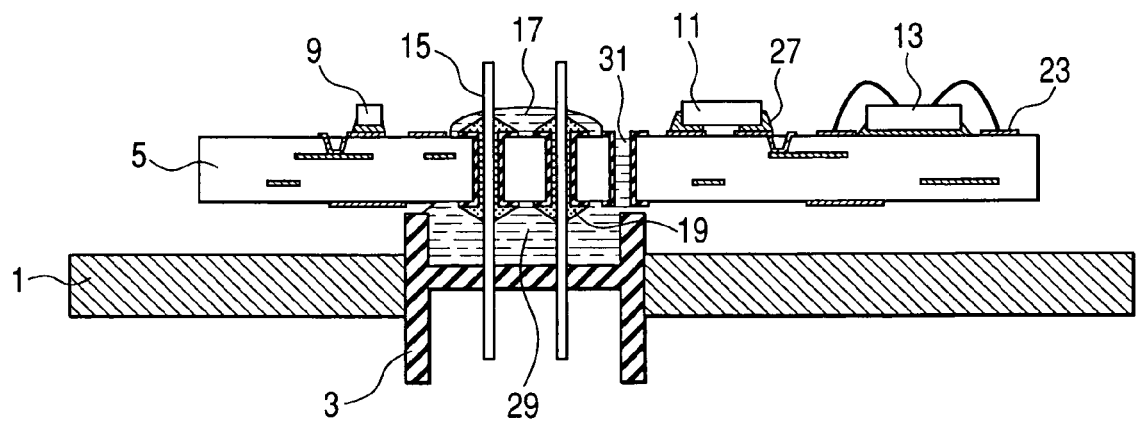
FIG. 4 is a cross sectional view of an electronic device.

FIG. 3 and FIG. 4 show embodiments in which reinforcing resins 17 and 29 are formed so as to cover the through hole solder connection portion not only for the board surface A but also the board surface B, that is, on both surfaces of the board.

Then, a production process for ECU modules of FIGS. 1 to 4 is to be described.

At first, the production process for the board 5 is described. As an insulating resin layer, a prepreg (i.e. preimpregnation) of highly heat resistant epoxy resin (FR4.5-type) is used. The prepreg is a member formed by dipping a sheet of glass fiber or the like into resin and coating the sheet with the resin. As the wiring layer, usual copper foil and copper plating are used. Wiring layers and insulation layers are laminated each by the required number and pressed, and apertures for continuous through holes are extended through by drilling. Wirings for the surface layer, pads for solder BGA connection and through hole inner wall member are formed by plating. Plating was formed by applying copper plating, nickel plating and further gold plating. While plating may be applied only by copper plating, nickel plating and gold plating are applied desirably for solder connection and for preventing oxidation of the surface.

Then, an aluminum casing 1 having two holes to which the connector can be inserted is manufactured by casting. The casing has protrusions for positioning the board or threaded holes for fixing the board.

Then, the connector 3 having the pins 15 is fitted into the aluminum casing 1. Both of them are bonded by adhesives. Electronic parts 9, 11, and 13 are put to reflow soldering at 250° C. by means of $Sn_3Ag_{0.5}Cu$ solder 27 at 250° C. and mounted to the board 5. The board 5 is positioned such that the pins 15 are inserted into the continuous through holes and they conform with the threaded holes of the casing and then fixed by screws. The back surface of the board is partially secured by adhesives. The continuous through holes 21 and the connector pins 15 are solder connected with $Sn_3Ag_{0.5}Cu$ solder so as to establish electrical connection between them. This connection is conducted by a spot flow method of blowing a molten solder partially. This allows for solder connection of the continuous through hole with no substantial re-melting of solder connection portions for other electronic parts on the board. Further, a liquid epoxy series resin is coated so as to cover the through hole connection portion and cured for 30 min at 150° C.

In the example shown in FIG. 3, the liquid epoxy resin is charged in a syringe, and coated so as to cover the soldered surface of the through hole connection portion on the board surface B by an elongate nozzle and then cured under the same conditions as described above.

In example shown in FIG. 4, the circuit board 5 is formed with one or more of separate continuous through holes 31 in addition to the continuous through holes for insertion of connector pin, a nozzle is inserted on the side of the board surface A and an epoxy resin 29 is injected to the board surface B. As shown in FIG. 4, a ridge is disposed to the connector main body resin to such an extent as reaching the surface of the board surface B so that the epoxy series resin can be saved. By saving the epoxy resin in the portion, the soldering surface of the through hole connection portion on the side of the board surface B can be covered with the epoxy series resin.

Figure 5:
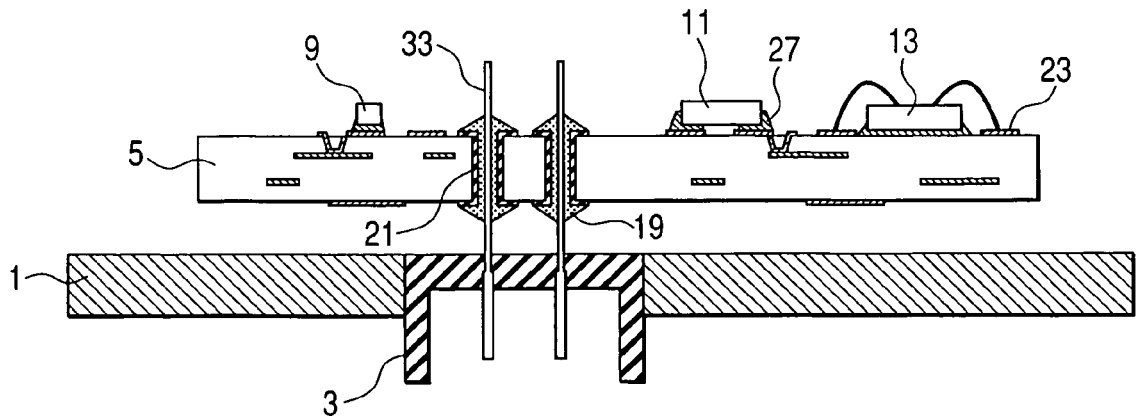
FIG. 5 is a cross sectional view of an electronic device.

In embodiment shown in FIG. 5, the diameter of the pin in the through hole connection portion is made smaller than the diameter of the pin in other portion in order to lower the rigidity of the pin 33. The pin diameter on the outer side of the connector 33 can not be changed freely in view of the restriction of the connection connector from the outside. The pin withdrawing strength can be improved when the diameter is changed inside the connector resin 3.

Figure 6:
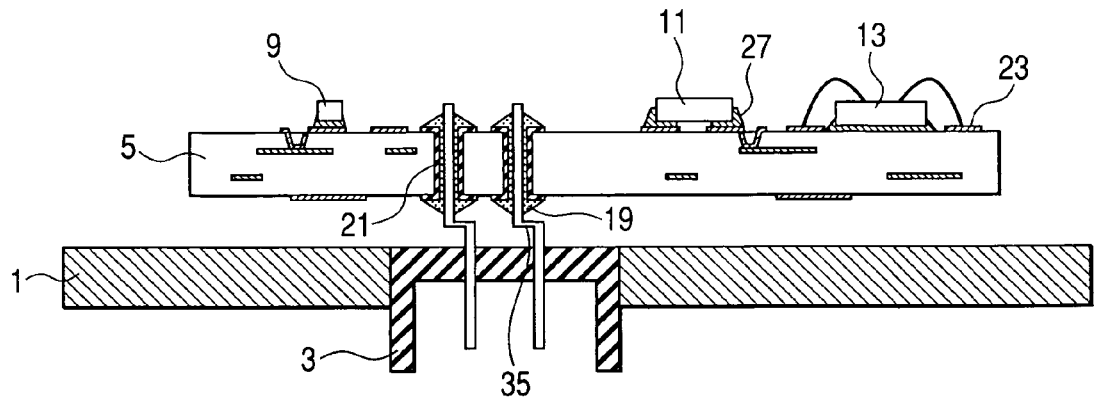
FIG. 6 is a cross sectional view of an electronic device.

FIG. 6 shows an embodiment of bending pins 35 between the board through hole connection portion and the connector resin 3 in order to lower the pin rigidity. It is more effect to bend the pin 35 in the direction relative away from the center of the board 5.

Figure 7:
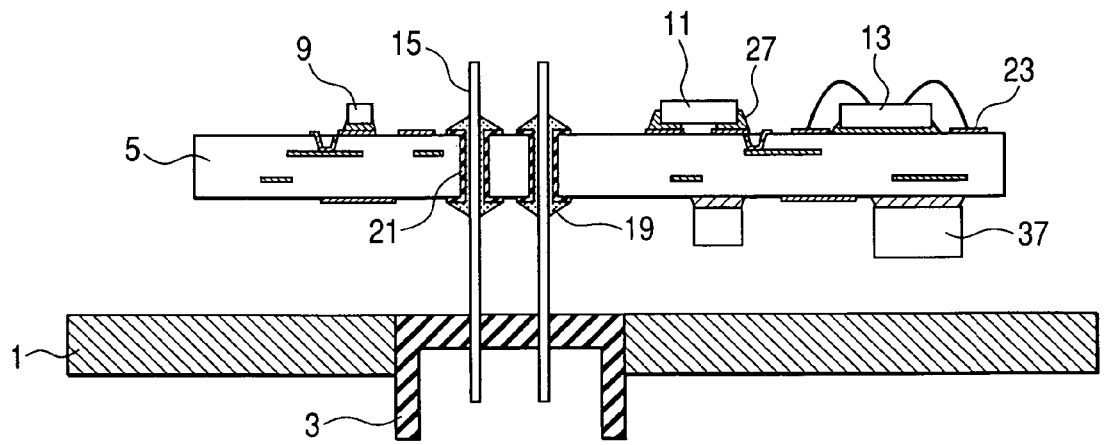
FIG. 7 is a cross sectional view of an electronic device.

FIG. 7 is an example of enlarging the distance (space) between the board through hole connection portion and the connector resin. Most of electronic parts are generally mounted on the board surface A (one surface while not opposed to the casing in board main surface.). A tall part, for example, an electrolytic capacitor is mounted on the board surface A in order to make the structure of the casing and the manufacture thereof more simply. In a case where the distance between the board through hole connection portion and the connector resin is enlarged while mounting such a part on the board surface A as it is, a larger inner volume of ECU is necessary. However, since the external size, etc. of ECU is often designated by car manufacturers, the ECU inner volume can not be increased simply. In view of the above, a tall part such as an electrolytic capacitor 37 is mounted on the board surface B (other surface while opposed to the casing in board main surface.). In such a structure, the distance (space) between the board through hole connection portion and the connector resin can be enlarged without increasing the inner volume of ECU, to avoid crackings in the solder through hole connection portion.

Figure 8:
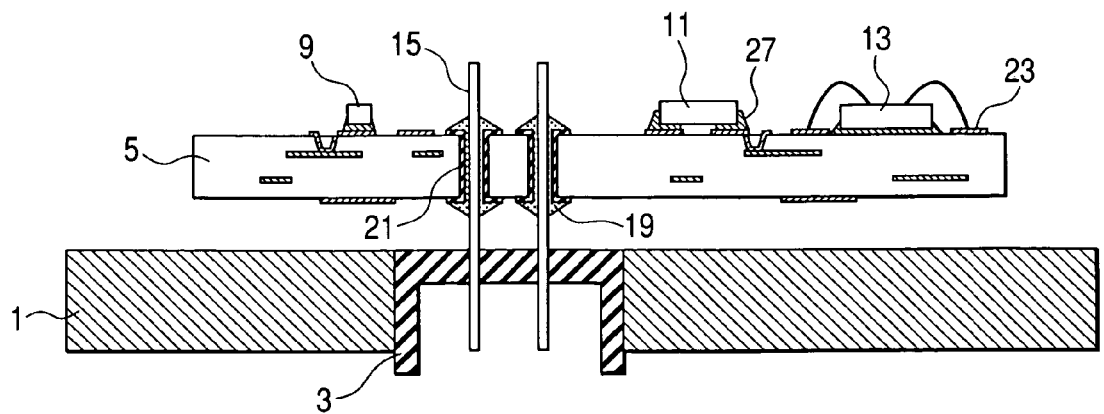
FIG. 8 is a cross sectional view of an electronic device.
Figure 9:
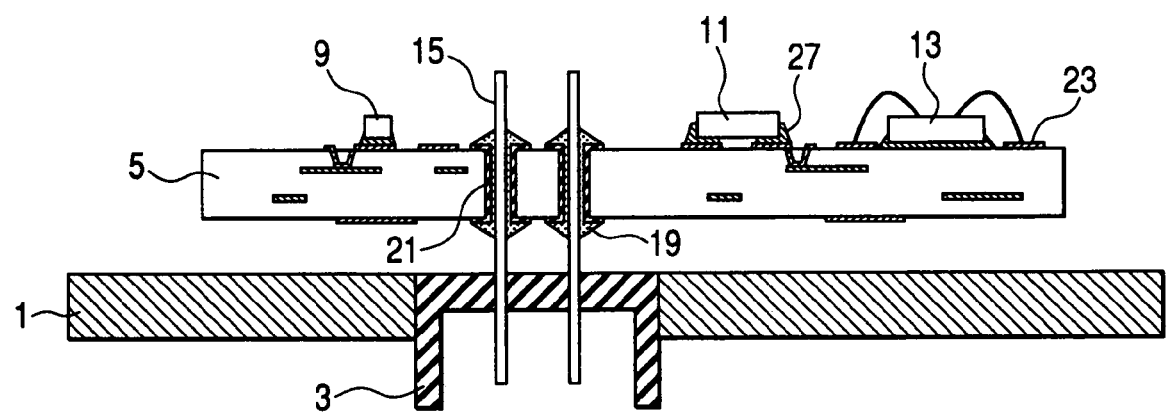
FIG. 9 is a cross sectional view of an existent (conventional) electronic device.

An electronic device shown in FIG. 8 differs from the existent electronic device shown in FIG. 9 by forming the metal casing 1 so as to produce a plurality of cavities in the inside of the member of the metal or the alloy (for instance, aluminum and alloy including this), though it has the section structure that looks like the existent electronic device. The metal casing 1 formed like this can discharge the heat accumulated in connector resin 3 by the surface area's increasing. As a result, it becomes difficult for the connector pin 15 to be destroyed because the thermal expansion of connector resin 3 is suppressed and brought close to that of printed circuit board 5. The metal casing 1 of FIG. 8 formed with the porous aluminum etc. is thick formed compared with other embodiments to secure the strength. This thickness may be adjusted to 80% or more of the thickness of the connector resin 3. The metal casing 1 may be produced by forming holes or hollows with the drill and the milling machine in the main surface by using board member of metal or alloy that has a usual density, instead of producing the metal casing 1 shown in FIG. 8 with the metal or the alloy of the porous quality.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. An electronic device comprising:
    a circuit board having a first surface on which an electronic part is mounted, a second surface opposite to the first surface, and through holes;
    a metal casing facing the second surface of the circuit board and having an opening; and
    a connector being fitted to the opening of the metal casing and having pins, each of which is inserted into one of the through holes, wherein each of the pins connected to one of the through holes with solder filled in the one of the through holes
wherein:
a base member of the circuit board is formed of a resin having a glass transition temperature exceeding 150° C.,
the pins and the solder connections thereof to the respective through holes on at least one of the first and second surfaces of the circuit board are coated with a reinforcement member, which is a non-conductive film being made of an epoxy series resin and covering the at least one of the first and second surfaces of the circuit board so as to avoid cracking of the solder connection, and wherein the reinforcement member is formed only to a part of the at least one of the first and second surfaces of the circuit board where the solder connections are formed.

2. An electronic device according to claim 1, wherein
the resin used for the base member of the circuit board is a resin comprising epoxy as a main ingredient.

* * * * *